(12) United States Patent
Gillespie et al.

(10) Patent No.: US 7,789,443 B2
(45) Date of Patent: Sep. 7, 2010

(54) WORKPIECE GRIPPING DEVICE

(75) Inventors: Joseph Gillespie, Boston, MA (US); Alexander H Slocum, Bow, NH (US); Allan Weed, Marblehead, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 609 days.

(21) Appl. No.: 11/687,184

(22) Filed: Mar. 16, 2007

(65) Prior Publication Data

US 2008/0224491 A1      Sep. 18, 2008

(51) Int. Cl.
*B25J 15/00*      (2006.01)
*B65G 49/07*      (2006.01)

(52) U.S. Cl. ............... 294/106; 294/99.1; 294/902; 414/941

(58) Field of Classification Search ............ 294/106, 294/902, 99.1, 1.1; 414/941; 269/274, 275
See application file for complete search history.

(56) References Cited

U.S. PATENT DOCUMENTS

| | | | |
|---|---|---|---|
| 4,020,846 A | | 5/1977 | Stokes |
| 4,353,537 A | * | 10/1982 | Koufos ............... 269/266 |
| 4,555,216 A | | 11/1985 | Buschor |
| 4,702,365 A | | 10/1987 | Pak |
| 4,798,645 A | | 1/1989 | Pak |
| 4,858,980 A | * | 8/1989 | Dreisig et al. ........... 294/99.1 |
| 5,172,951 A | | 12/1992 | Jacobson et al. |
| 5,207,324 A | | 5/1993 | Kos |
| 5,431,421 A | | 7/1995 | Thompson et al. |
| 5,876,026 A | * | 3/1999 | Chen ............... 269/156 |
| 6,082,540 A | * | 7/2000 | Krampotich et al. ....... 206/445 |
| 6,174,011 B1 | * | 1/2001 | Keigler ............... 294/99.1 |
| 6,183,813 B1 | | 2/2001 | Martini |
| 6,190,103 B1 | | 2/2001 | Erez et al. |
| 6,491,330 B1 | | 12/2002 | Mankame et al. |
| 6,513,848 B1 | | 2/2003 | Shendon et al. |
| 6,578,893 B2 | | 6/2003 | Soucy et al. |
| 6,592,324 B2 | * | 7/2003 | Downs et al. ........... 414/741 |
| 6,913,302 B2 | | 7/2005 | Yokota et al. |
| 6,918,735 B2 | | 7/2005 | Urban et al. |
| 6,942,265 B1 | * | 9/2005 | Boyd et al. ........... 294/64.1 |
| 7,140,655 B2 | * | 11/2006 | Kesil et al. ........... 294/104 |
| 7,300,082 B2 | * | 11/2007 | Rogers et al. ........... 294/104 |
| 2001/0036394 A1 | | 11/2001 | Tanaka et al. |

FOREIGN PATENT DOCUMENTS

JP      8090477      9/1996

* cited by examiner

*Primary Examiner*—Dean J Kramer
(74) *Attorney, Agent, or Firm*—Tarolli, Sundheim, Covell & Tummino LLP

(57) ABSTRACT

A gripper for use with a robot includes a support body for removably attaching the gripper to a moveable arm and a workpiece contact body having a groove extending along at least a portion of the contact body for engaging a curved outer edge of the workpiece. A coupling member connects the support body to the workpiece contact member and includes a flexure component that flexes to allow radial and/or tangential relative movement of the workpiece contact body with respect to the support body to diminish slippage between the workpiece and the contact body as the gripper engages the workpiece.

3 Claims, 5 Drawing Sheets

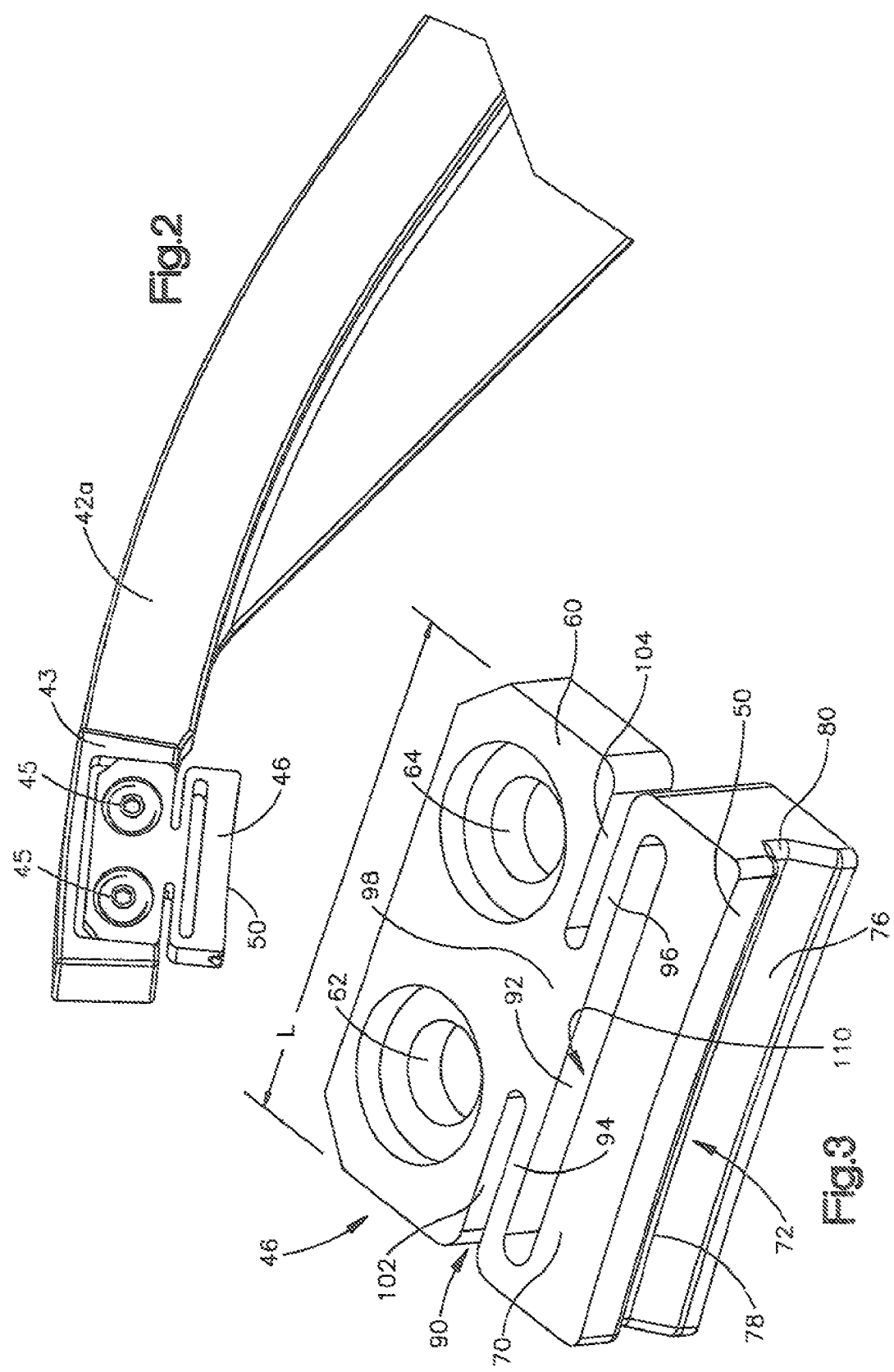

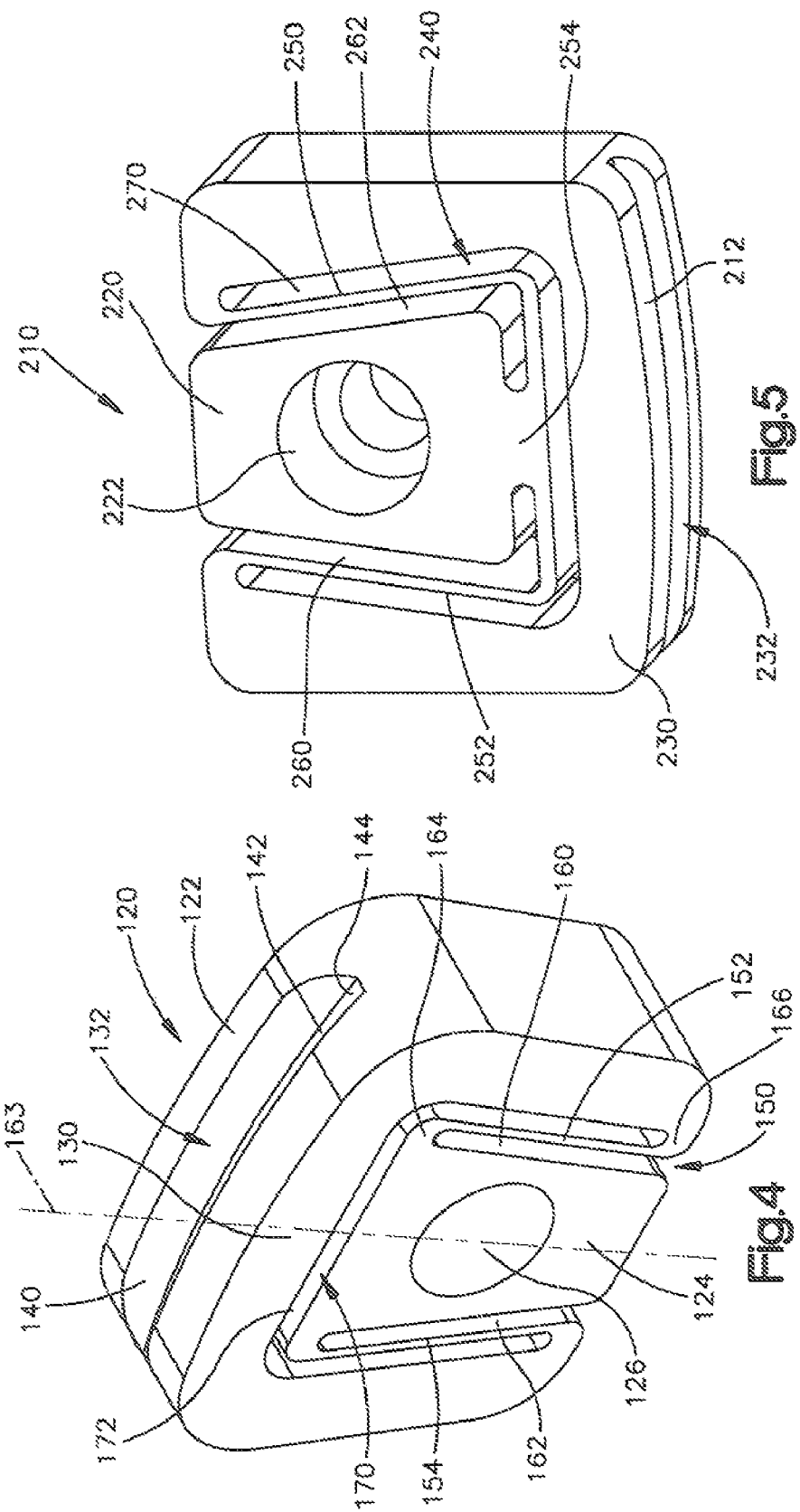

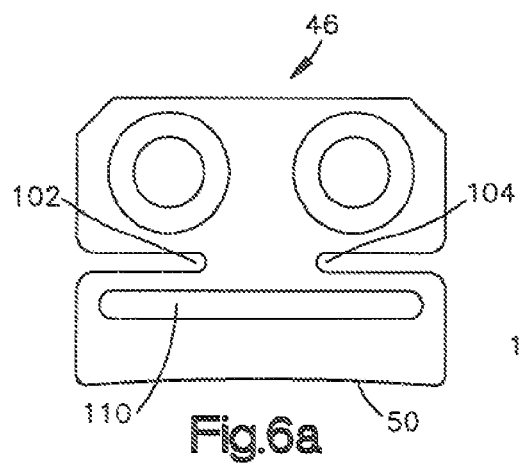
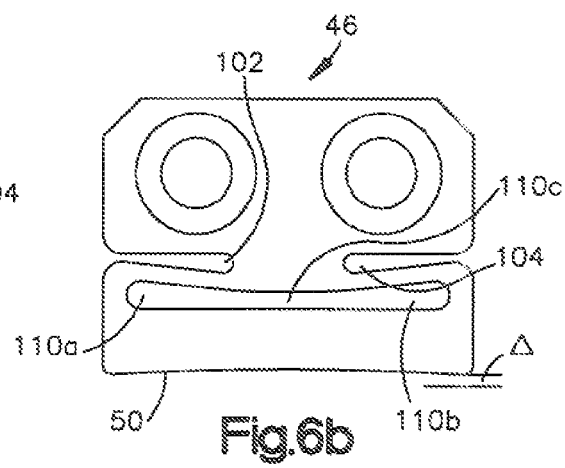
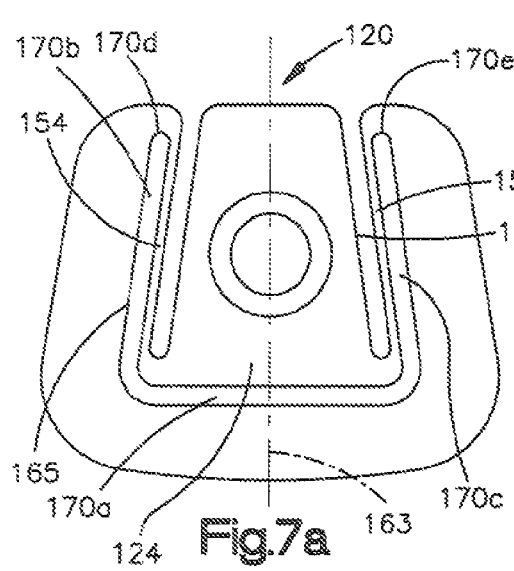
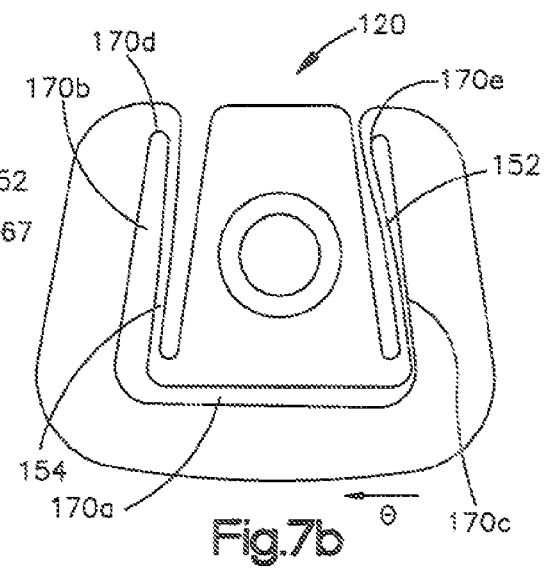
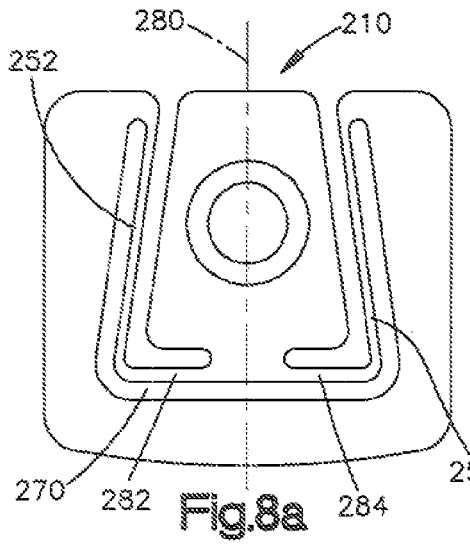
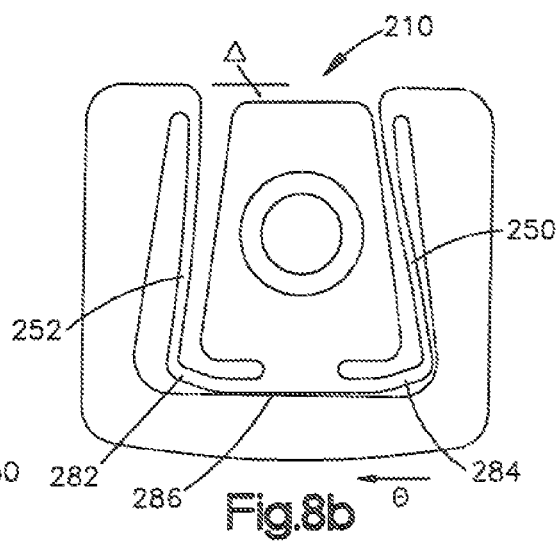

WORKPIECE GRIPPING DEVICE

FIELD OF THE INVENTION

The present invention relates to a gripping device for use with a wafer workpiece treatment tool. The gripping device lessens generation and wafer position variations when chucking a wafer for transfer within a processing environment.

BACKGROUND ART

There are different types of tools for controllably treating one or more wafer workpieces such as silicon wafers used in semiconductor circuit fabrication. As an illustrative example, ion implanters selective dope silicon wafers by bombarding them with ions of a controlled concentration.

Such processing tools include robots for moving wafers along controlled travel paths from one workstation to a next workstation until all processing steps have been performed. In the illustrative example, an ion implanter includes a robot that moves untreated wafers from a cassette storage device to a load lock through which the wafer is inserted into a low pressure implantation chamber where it is grasped and manipulated by another robot. These robots have movable arms that grip the wafer and release the wafer once it has been delivered to a desired position/orientation.

When a wafer engages a support such as a robot gripper mechanism sometimes referred to as a chuck, particles are generated as a result of the clamping chuck impacting the wafer's edge and from the wafer's edge sliding along the clamp chuck contact surface caused by slight chuck to wafer misalignments. Particle generation increases as the impact force increases and as the degree of misalignment increases.

After the wafer is chucked, additional particles can be generated from the wafer shifting within the chuck. This is caused by the wafer transfer mechanisms clamping force deflecting the gripper arms and chucks. As a result, the position and angle of the clamping chuck relative to the wafer changes causing the wafer to shift within the chuck. This deflection also results in wafer position errors during wafer treatment by the tool.

SUMMARY

Practice of the disclosed system reduces the impact force between the gripper chuck and the workpiece by providing damping local to the chuck to wafer interface. It also provides compliance to account for any setup variations, wafer tolerances and system tolerance stack-up, reducing the affect of chuck to wafer misalignments.

An exemplary gripper holds a workpiece having a curved outer edge during movement and/or rotation of the workpiece during treatment of the workpiece. A representative workpiece is a thin generally circular wafer, such as a silicon wafer that is treated during fabrication of a semiconductor material.

The gripper includes a support body for removably attaching the gripper to a moveable arm and a workpiece contact body having a groove extending along at least a portion of the contact body for engaging a curved outer edge of the workpiece. A coupling member supports the contact body relative to the support body and allows relative movement between the two to allow radial and/or tangential relative movement of the workpiece contact body with respect to the support body to diminish slippage between the workpiece and the contact body as the gripper engages the workpiece. The result is the wafer acts as if it is effectively being supported by one point and two rolling contacts so sliding contact forces, and hence particle generation, are minimized. Furthermore, since the motions are small and space limited, flexural elements are used where their inclinations allow the instant center of rotation of the contact point to be positioned to minimize slipping.

These and other objects, advantages, and features of the disclosure will become better understood from the disclosed detailed description of the exemplary embodiment which is described in conjunction with the accompanying drawings.

BRIEF DESCRIPTION OF THE DRAWINGS

FIG. 2 is an enlarged view of one end of a robot arm supporting a gripping member;

FIG. 3 is an enlarged perspective view of one embodiment of a gripping member;

FIGS. 4 and 5 are enlarged perspective views of two alternate embodiments of gripping members;

FIGS. 6a, 6b, 7a, 7b, 8a, and 8b show before and after depictions of three alternative gripping devices;

EXEMPLARY EMBODIMENT

One illustrative use of the invention is for gripping and manipulating a wafer workpiece that is treated by a concentrated ion beam. Other tools known in the semiconductor processing field use robots or other transfer devices for grasping, moving and/or reorienting a thin wafer workpiece during treatment. Representative alternative uses are rapid thermal heating tools and tools for selectively masking surfaces of the workpiece.

A typical ion implantation system includes an ion generating source and a beam analyzing magnet that causes ions of a desired charge to mass ratio to follow a controlled travel path though an evacuated region and enter an ion implantation chamber. Along the travel path of the ion beam from the source to the implantation chamber, the beam is shaped, filtered, and accelerated to a desired implantation energy so that when it strikes wafer workpieces in the ion implantation chamber those workpieces are doped with controlled ion concentrations.

Figure 1:
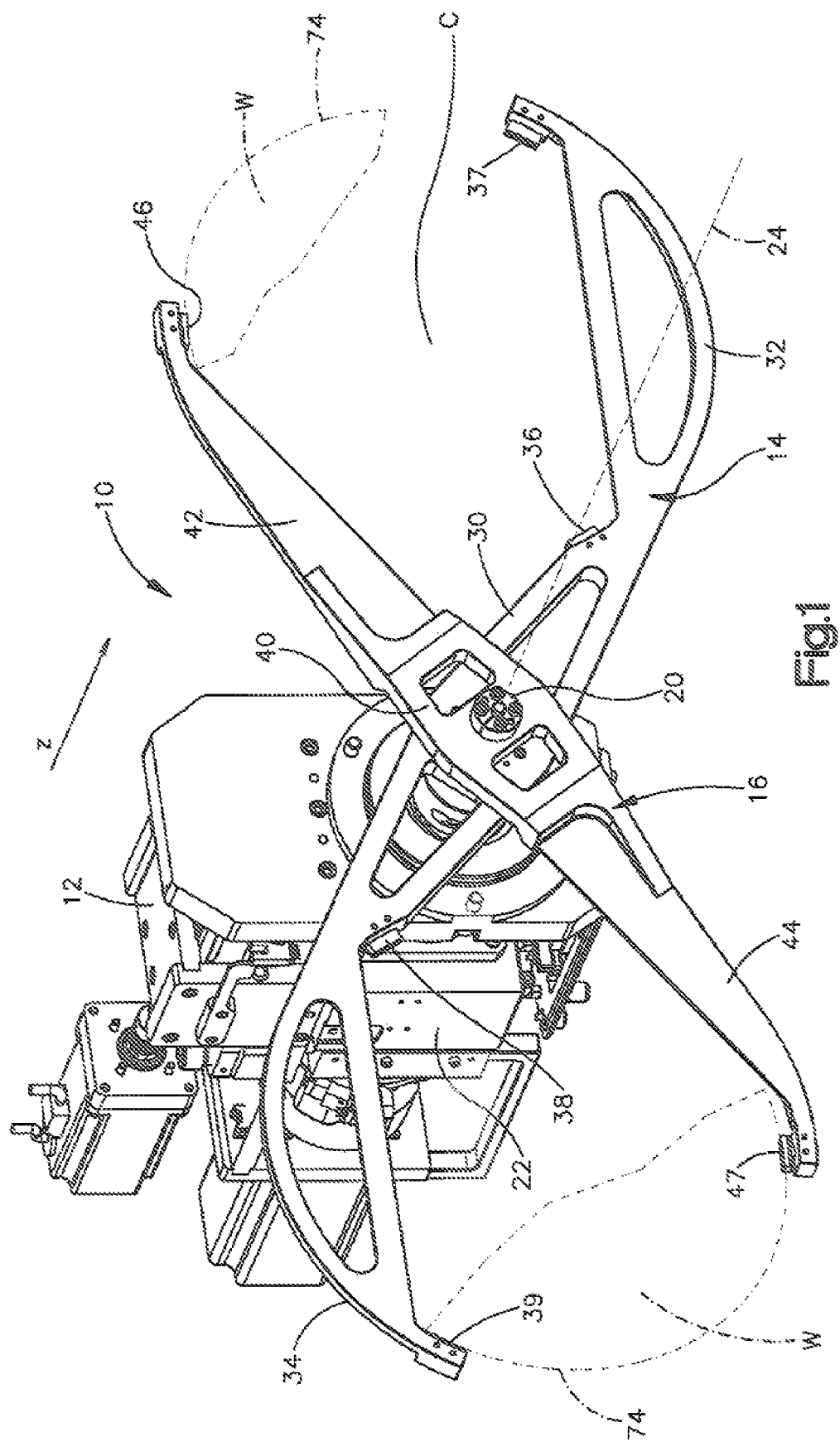
FIG. 1 is schematic perspective view of an ion implanter robot for positioning wafers within an ion implanter.

FIG. 1 depicts a wafer transfer station 10 positioned in vacuum within a representative ion implantation chamber. A robot 12 includes an elongated set of two transfer arms 14, 16 mounted to a shaft 20 extends outwardly from a robot base 22 in a generally z direction as that co-ordinate is defined in FIG. 1. Computer controlled actuation of motors and a pneumatic actuator supported by the base 22 cause the arms 14, 16 to translate in the z direction as well as rotate both individually and in unison about a center axis 24 that coincides with the center of the shaft 20.

The robot arms simultaneously translate and/or rotate two wafer workpieces W with respect to a load lock and an ion beam treatment station. As depicted in FIG. 1, the arm 14 has a center section 30 that connects two end portions 32, 34. A first end portion 32 supports two griping members 36, 37 for gripping a wafer workpiece. The second end portion 34 diametrically opposite to the first end portion supports two additional gripping members 38, 39.

The second arm 16 has a center section 40 that connects two end portions 42, 44. A first end portion 42 supports a single gripping member 46 for gripping a wafer workpiece and the second end portion 44 supports an additional gripping member 47.

The transfer station 10 depicted in FIG. 1 can support two workpieces on opposite sides of the center axis of rotation 24. The gripping members 36, 37, 46 bound a region occupied by a generally circular workpiece W having a center C. In the illustrated configuration these gripping members 36, 37, 46 are equally spaced 120 degrees apart.

The robot 12 uses the gripping members to grasp and remove an untreated wafer workpiece from a load lock on one side of the axis of rotation. The workpiece is inserted into the load lock by an in-air robot (not shown). On the opposite side of the axis of rotation 24, the workpiece is treated by a controlled energy ion beam. Once a workpiece is removed from the loadlock, selective energization of drive motors coupled to the robot base moves the securely held wafer workpiece W to a position for beam treatment and an already treated wafer workpiece is rotated back into the load lock for removal from the implanter.

To securely grasp a workpiece the robot 12 causes the arm 16 to rotate slightly (approximately 3 degrees) in a counter clockwise direction, and then causes arms 14 and 16 to rotate clockwise in unison slightly (approximately 1.5 degrees) as seen in FIG. 1 to allow insertion of the workpiece into the region bound by the arms. Arms 16 and 14 are then rotated counter clockwise in unison a correspondingly small amount, bringing the gripping members 36 and 37 into contact with an edge of the workpiece. Arm 16 is then rotated slightly in a clockwise direction, bringing gripping member 46 into contact with an edge of the workpiece to secure the workpiece against gripping members 36, 37.

FIG. 2 depicts an enlarged view of a gripper support portion 42a at the end 42 of the arm 16. The support portion includes a generally flat generally rectangular feature 43 through which two threaded openings (not shown) extend. In the enlarged depiction of FIG. 2, the gripping member 46 is attached to the flat rectangular 43 by connectors 45 passing through the gripping member 46 to engage the support portion 42a of the arm. This mounting arrangement allows replacement of the gripping members.

FIG. 3 is an enlarged perspective view of the gripping member 46. The gripping member 46 has a slightly concave curved outer surface 50 having a radius of curvature generally the same as the workpiece W. This outer surface 50 may alternately be flat or convex. The surface 50 faces radially inwardly toward a center C of the workpiece W during manipulation of the workpiece by the robot 12. When mounted to its associated arm, a support body 60 is spaced radially outward (with respect to the workpiece center C) from this curved outer surface 50. The support body 60 includes two mounting openings 62, 64 to accommodate the connectors 42, 44 of FIG. 2 for securing the gripping member 46 to its associated support arm.

The curved outer surface 50 forms part of a workpiece contact body 70 that defines a groove 72 extending along at least a portion of the contact body 70 and engages a curved outer edge 74 (FIG. 1) of the workpiece W. In the illustrated embodiment the groove or notch 72 extends completely across a length L of the contact body 70. A notch entryway is defined by two sloped or angled surfaces 76, 78 that angle toward a bottom 80 of the groove. The representative gripping member has a groove length from one side to the other of approximately 20 mm's.

Joining the two bodies 60, 70 is a coupling member 90. This connecting or coupling member has a flexure component that flexes to allow slight radial (with respect to the center C of the workpiece) and pivoting relative movement of the workpiece contact body with respect to the support body. Allowing such movement tends to avoid slippage between the workpiece and the gripping member's contact body as a force of engagement increases between the gripping member and the workpiece. (The movement also provides impact dampening upon contact to reduce the force of engagement between the workpiece and the gripping member) In the illustrated embodiment, the gripper 46 is a single, integral plastic piece constructed of Vespel®, commercially available from DuPont. Alternative materials that have adequate wear, flexural modulus, and fatigue strength characteristics may be used having flexibility sufficient to accommodate this relative movement.

In the embodiment illustrated in FIG. 3, the flexure component includes two elongated arms 94, 96 that extend away from a center section 98 wherein the coupling member 90 engages the support body 60. The arms are spaced from the support body by narrow gaps 102, 104 bound on one side by a sidewall of the support body and on another side by the arm. In the illustrated embodiment the center region 98 and two gaps 102, 104 each extend approximately one third of the length L of the gripping member 46. Extending through a thickness of the gripping member 46 is an elongated slot 110 having a width of approximately 1.5 mm inches and length of approximately 17 mm that spaces the workpiece contact body from the center section of the support body. The 94, 96 have a thickness of 1 mm and width of 7 mm. The body 70 (including the arms 94, 96) is thicker than the support body 60 which has a thickness of about 6 mm.

The gripping element 46 may also incorporate flexural elements that also impart compliance in a direction tangent to the wafer edge to provide additional reduction in the potential to produce particles, such as shown in the element 210 in FIG. 5.

Alternate Embodiments

In an alternative embodiment, additional prevention of potential slippage between the gripper and the wafer can be provided by making at least two, but preferably all three of the gripping elements compliant, such as with element 120 in FIG. 4, in a direction tangential to the edge of the wafer. In addition, if at least one of the gripping elements has radial compliance, such as element 210 in FIG. 5, then radial dampening is provided.

FIG. 4 is an enlarged perspective view of an alternate construction of a gripping member 120. The gripper member 120 has a convex (This surface could also be concave or generally flat) curved outer edge 122 that faces a region occupied by a workpiece W during controlled movement of the workpiece by the robot 10. Spaced from this curved outer edge 122 is a support body 124 having a mounting opening 126 to accommodate a single connector that secures the gripping member 120 to its associated support arm.

The curved edge 122 is defined by a workpiece contact body 130 that defines a groove 132 extending along at least a portion of the contact body for engaging a curved outer edge 74 (FIG. 1) of the workpiece W. In the illustrated embodiment the groove or notch 132 extends completely across a side of the contact body 130. The notch has is defined by two sloped or angled surfaces 140, 142 that angle toward a bottom 144 of the groove. The representative gripping member is generally rectangular in plan and has a width of 25 mm's, a height of 20 mm's and a thickness of 11 mm's.

A coupling member 150 connects the support body to the workpiece contact body. This connecting or coupling member has a flexure component that flexes to allow tangential relative movement of the workpiece contact body with respect to the support body to avoid slippage between the workpiece and the contact body as a force of engagement increases between the gripper and the workpiece. The intent of this gripper is to provide tangential relative movement while still have high radial stiffness. This is possible since when the gripper comes into contact with the workpiece the radial force puts the flexure components in tension and the radial movement is minimal. The FIG. 4 embodiment is used for applications where precise wafer positioning is required. For example, the arm 14 would support gripping members 120. Since this arm contacts the wafer with 2 gripping members that allow minimum radial movement, the robot would accurately and repeatedly determine the centering of the wafer. The arm 16 would have a gripping member 210 (described below). Since the arm 16 forces the workpiece against the 2 gripping members 120 on the arm 14 radial movement of this gripper is allowed. Radial movement of gripper 210 will not affect the centering of the wafer since the centering is determined by the 2 grippers 120 that do not allow radial movement. Like the FIG. 3 embodiment, the FIG. 4 embodiment is a single, integral plastic piece.

In the embodiment illustrated in FIG. 4, the gripper flexure component comprises two elongated arms 152, 154. The dimensions are 0.75 mm wide by 8 mm deep by 12 mm long) The arms are spaced from the support body by narrow gaps 160, 162 bound on one side by a sidewall of the support body and on another side by the arms. The flexure arms are symmetric with respect to a center line 163 passing through a center portion of the body. The flexure arm is attached to the support body at a forward portion 164 of said support body at a region of closest separation between the support body and the outwardly facing surface 122 of the contact body and is attached to the contact body at a region 166 of greatest separation from the outwardly facing surface 122 of said contact body. In an unflexed state the arms are spaced by a spacing or gap along an elongated portion of their length from side walls 165, 167 of both the support and contact bodies.

A U shaped gap 170 bounds an outwardly facing surface 172 of the support body 124 and separates the body from the contact body 130. In a region 170a (FIG. 7a) of the support body 124 that faces the center C of the workpiece during use, the gap is generally straight. Two side regions 170b, 170c of the gap make an angle with respect to the region 170 of somewhat less than ninety degrees so that the U shaped gap 170 is pinched together at its ends 170d, 170e at a location in the body removed from a contact region with the workpiece W. In an unstressed condition such as shown in FIG. 7a, before the gripping member 120 contacts the workpiece, the width of the gap 170 is approximately 1 mm.

FIG. 5 is an enlarged perspective view of an additional alternate gripping member 210. The gripping member 210 has a curved slightly convex (This surface may also be concave or generally flat) outer edge 212 that faces a region of occupied by a workpiece W during manipulation of the workpiece by the robot 12. Spaced from this curved outer edge is a support body 220 that defines a mounting opening 222 to accommodate a single connector that secures the gripping member 210 to its associated support arm.

The curved edge 212 is defined by a workpiece contact body 230 that defines a groove 232 extending along at least a portion of the contact body for engaging a curved outer edge 74 (FIG. 1) of the workpiece W. In the illustrated embodiment the groove or notch 232 extends completely across the region the contact body 70. Similar to the notch of the FIG. 4 embodiment, the notch 232 is defined by two sloped or angled surfaces that angle toward a bottom of the groove 232. The representative gripping member has dimensions similar to those for the FIG. 4 embodiment.

A coupling member 240 connects the support body 220 to the workpiece contact body 230. This connecting or coupling member having a flexure component that flexes to allow both radial and tangential relative movement of the workpiece contact body with respect to the support body thereby avoiding slippage between the workpiece and the contact body as a force of engagement increases between the gripper and the workpiece. Like the other embodiments, the gripping member 210 is a single, integral plastic piece constructed of Vespel® but other materials that have adequate wear, flexural modulus, and fatigue strength characteristics may be used.

In the embodiment illustrated in FIG. 5, the gripper flexure component comprises two elongated L shaped arms 250, 252 that extend away from a center section 254 wherein the coupling member engages the support body 220. The arms are spaced from the support body 230 by narrow gaps 260, 262 bound on one side by a sidewall of the support body and on another side by the arm itself. A significant length of the arms are spaced from the body 230 by a gap 270 similar to the gap 172 defined by the FIG. 4 embodiment.

Operation

Controlled rotation of the robot arms 14, 16 causes the gripper members to secure wafer workpieces for subsequent movement. As the force of engagement between the gripper members increases, the construction of those gripping members allow relative movement of the support and contact bodies of the various embodiments.

The gripping member 46 (depicted in FIG. 6a) is located on the clamp arm 16 only and provides a radial compliance. Radial compliance refers to the fact that as the workpiece contacts the gripper, the gripper gives or flexes outward in the radial direction (with respect to the wafer workpiece center C). Grippers 36, 37 on the fixed arm 14 have no radial compliance for accurate and repeatable wafer positioning. Radial compliance reduces the impact force from clamping the wafer by providing dampening local to the chuck to wafer contact point. Radial compliance is also important in this specific system, where a single set of two arms clamps two wafer workpieces W, to account for small wafer diameter variations of the generally circular wafer workpieces to make sure both wafers are clamped properly.

FIGS. 6a and 6b are before and after depictions showing a degree of radial compliance for the gripping members 46. As the workpiece enters the notch 72 it contacts the base or bottom 80 and exerts an outward force against the contact body 70. The two arms 94, 96 bend at their outer ends narrowing the two gaps 102, 104. (See FIG. 6b) The gap 110 is pinched inward at its center 110c an amount Δ (which would be as much as 0.5 mm depending on the length, width, and thickness of the arms, as well the material properties, and degree of outward force) while the two ends of the gap 110a, 110b maintain their separation from the body 50 as the arms bend. The gap 110 becomes dogbone or barbell shaped as seen in the plan view of FIG. 6b.

During wafer handoffs from one mechanism to another, there is typically some degree of misalignment. As a result some grippers will contact the wafer workpiece before others of the gripping members as the wafer is clamped. As the arms clamp the wafer, the wafer slides with respect to the grippers until all three grippers are in contact and the wafer is constrained. This sliding will inevitably generate particle contaminants.

Non-slip grippers 120 have a tangential compliance so the gripper moves and the wafer does not slide with respect to the gripper contact surface. Non-slip grippers located on the fixed arm 14 have little or no radial compliance but do have a tangential compliance. Tangential compliance means the ability of the gripper to move tangentially as the gripper contacts the curved outer surface of the wafer workpiece.

This tangential compliance is depicted in the illustrations of FIGS. 7a and 7b. Assume the workpiece edge 74 contacts the gripping member 120 slightly off center so that the workpiece exerts a sideways (or tangential) force component against the gripper 120. Since the contact is not exactly radial along the centerline 163, the force has both a radial (larger) and tangential (smaller) component. Rather than slide across the edge 74, the gripper arms 152, 154 bend and the contact body shifts tangentially an amount θ. There is no (or very little) radial compliance, however, due to the fact that the arms 152, 154 are in tension.

The embodiments of FIGS. 4 and 5 have flexural elements in the form of elongated arms 152, 154, 252 and 250. The arms of a given embodiment define a position of a center of rotation of a gripping contact body. This position is defined by the inclinations of the flexural arms with respect to each other. More specifically, a center of rotation is defined generally as a point intersected by two lines extending parallel to, and coinciding with, the elongated arms (152, 154 for example). As depicted this point is generally coincident with the centerline 163 of the gripper 120 spaced away from the workpiece.

The arms 152, 154 are attached or coupled to the generally trapezoidal shaped support body 124 at a location radially closer to the workpiece center C than a location where the arms are attached to the contact body 130. Contact forces tend to push the body 130 toward the body 124 to increase the tension in the arms. The arms easily withstand such force and results in essentially no elongation of the arms. The gap portion 170a remains constant in width but due to the sideways flexure of the arms, the gaps 170b, 170c widen and narrow.

The gripping member depicted in FIG. 5 has both radial and tangential compliance for impact dampening and proper clamping of the wafer. This operation is depicted in FIGS. 8a and 8b.

Assume the workpiece edge 74 contacts the gripping member 210 slightly off center (i.e. not along the center line 280) so that the workpiece exerts a sideways (or tangential) force component against the gripper 210. As in the case of the gripper 120 of FIG. 7a, rather than slide across the edge 74, the gripper arms 250, 252 bend and the contact body 230 shifts tangentially a small amount θ.

In the instance of the FIG. 8a embodiment, there is a radial compliance, however, due to the fact that the arms 250, 252 are L shaped and include short transverse leg portions 282, 284 that flex or bend in response to the radial force exerted against the workpiece by the contact body.

The generally L shaped arms 250, 252 are attached or coupled to the support body 220 at a location radially closer to the workpiece center C than a location where the arms are attached to the contact body 230. Due to the flexing or bending of the arms in to the side (tangentially) as well as radially. The gap 270 narrows on one side (which side depends on the angle of slight misalignment) widens on one side and narrows in the middle by an amount up to the width of the gap 270. In the depiction of FIG. 8b the deflection in the radial compliance is shown to be a maximum deflection Δ since juxtaposed surfaces of the bodies 220, 230 actually contact each other in the region 286.

Figure 9B:
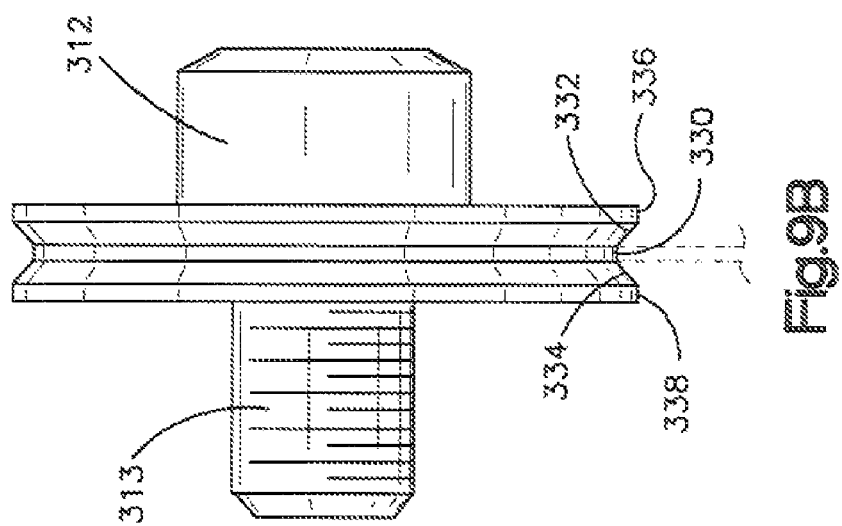
FIGS. 9A and 9B depict an alternate gripping mechanism for gripping a wafer workpiece.
Figure 9A:
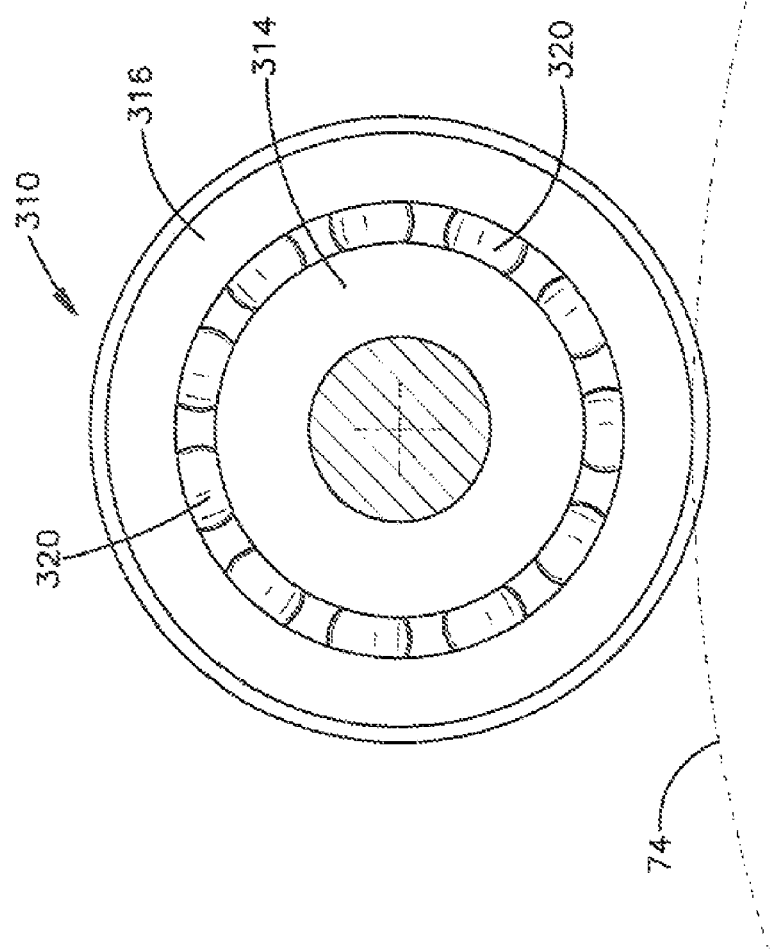

While flexural elements are shown here, rolling contact bearings can also be used in place of the flexures described above. FIGS. 9A and 9B depict a gripping member 310 that includes a support body 314 for removably attaching the gripping member 310 to a moveable support such as the arm 16. The support body is attached to the arm by a connector having a shank 313 and head 312 wherein the shank passes through an opening in the support body 314 and threadingly engages the arm. A workpiece contact body 316 engages an edge 74 of the workpiece. A coupling member in the form of a number of rolling element bearings 320 support the contact body 316 relative to the support body to allow relative movement of the support body and the workpiece contact body to diminish contact forces between the workpiece and the contact body as the gripper engages the workpiece.

The embodiment of FIGS. 9A and 9B the support body 314 and contact body 316 define a circular bearing race that surrounds a fixed portion of the support body. As depicted most clearly in FIG. 9B, the contact body defines a v groove having a base portion 330 bounded by angled sidewalls 332, 334 which contacts a workpiece and frictionally grip the workpiece. The sidewalls 332, 334 extend outwardly to narrow edges 336, 338. The contact body is a plastic material such as the aforementioned Vespel® material.

Although alternate exemplary embodiments of the invention have been described with a degree of particularity, it is the intent that the invention encompasses all modifications and alterations from those designs falling within the spirit or scope of the appended claims.

The invention claimed is:

1. Apparatus for holding a semiconductor wafer during movement and/or rotation of the wafer comprising:
    a) first and second elongated arms for trapping a wafer between said arms for movement and/or rotation;
    b) at least three grippers mounted to the first and second elongated arms; and
    d) a drive for relatively moving the first and second arms with respect to each other to grasp the wafer with all three grippers;
    e) wherein one gripper comprises
        i) a support body for removably attaching the one gripper to the first or second elongated arms;
        ii) a workpiece contact body for engaging an edge of the wafer; and
        iii) a coupling member having a flexure component having two flexure arms connecting the contact body to the support body that bend in response to contact with the wafer and allow relative movement of said support body and said workpiece contact body to diminish contact forces between the workpiece and the contact body as the gripper engages the wafer.

2. The gripper of claim 1 wherein the flexure arms are coupled to the support body and spaced along a portion of their length by a gap that separates a portion of the flexure arms from the contact body.

3. Then gripper of claim 1 wherein a portion of the two flexure arms are spaced from the support body by first and second elongated gaps that extends along opposite sides of the support body.

* * * * *